United States Patent
Yokokawa et al.

(10) Patent No.: US 7,524,744 B2
(45) Date of Patent: Apr. 28, 2009

(54) METHOD OF PRODUCING SOI WAFER AND SOI WAFER

(75) Inventors: Isao Yokokawa, Gunma (JP); Hiroji Aga, Gunma (JP); Kiyotaka Takano, Gunma (JP); Kiyoshi Mitani, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 232 days.

(21) Appl. No.: 10/544,374

(22) PCT Filed: Feb. 13, 2004

(86) PCT No.: PCT/JP2004/001557

§ 371 (c)(1),
(2), (4) Date: Aug. 3, 2005

(87) PCT Pub. No.: WO2004/075298

PCT Pub. Date: Sep. 2, 2004

(65) Prior Publication Data

US 2006/0051945 A1 Mar. 9, 2006

(30) Foreign Application Priority Data

Feb. 19, 2003 (JP) ............................. 2003-040875

(51) Int. Cl.
*H01L 21/425* (2006.01)

(52) U.S. Cl. ........................ 438/526; 438/530; 438/766; 438/770; 257/E21.339; 257/E21.563

(58) Field of Classification Search ................. 438/440, 438/526, 514, 515, 522, 542, FOR. 301, FOR. 310, 438/480, 473, 471, 455, 458, 530, 766, 765, 438/769, 770, 408, 418, 423, FOR. 221, FOR. 257, 438/402, 403, 420; 257/E21.339, E21.537, 257/E21.563, 347, E27.112, E21.32, E21.561, 257/E21.318, E21.321

See application file for complete search history.

(56) References Cited

U.S. PATENT DOCUMENTS 5,310,689 A * 5/1994 Tomozane et al. .......... 438/766

(Continued)

FOREIGN PATENT DOCUMENTS

CN 1241016 A 1/2000

(Continued)

OTHER PUBLICATIONS

SIMOX; Surface Science Technology Series No. 4; Apr. 19, 2004; pp. 26-30.
Surface Science Technology Series, No. 4, UCS, Apr. 19, 2000, "Science of SOI", 3 pages with English-language translation.

*Primary Examiner*—Matthew Smith
*Assistant Examiner*—Quovaunda Jefferson
(74) *Attorney, Agent, or Firm*—Oliff & Berridge, PLC (57) ABSTRACT

The present invention provides a method of producing an SOI wafer, comprising at least steps of forming an oxygen ion-implanted layer by implanting oxygen ions into a silicon wafer from one main surface thereof, subjecting the silicon wafer to oxide film-forming heat treatment to convert the oxygen ion-implanted layer into a buried oxide film, and thereby producing an SOI wafer having an SOI layer on the buried oxide film, wherein when the buried oxide film is formed in the silicon wafer, the buried oxide film is formed so that a thickness thereof is thicker than a thickness of the buried oxide film which the SOI wafer to be produced has, and thereafter the silicon wafer in which the thicker buried oxide film is formed is subjected to a heat treatment to reduce the thickness of the buried oxide film. Thereby, there can be provided a method of producing an SOI wafer in which a high quality SOI wafer having a buried oxide film of which a film thickness is thin and perfectness is high and an SOI layer of which crystallinity and surface quality are extremely good can be produced by using SIMOX method.

5 Claims, 3 Drawing Sheets

U.S. PATENT DOCUMENTS

| | | | |
|---|---|---|---|
| 5,658,809 A * | 8/1997 | Nakashima et al. | 438/766 |
| 5,795,813 A * | 8/1998 | Hughes et al. | 438/423 |
| 5,955,767 A * | 9/1999 | Liu et al. | 257/369 |
| 6,245,645 B1 | 6/2001 | Mitani et al. | |
| 6,313,014 B1 * | 11/2001 | Sakaguchi et al. | 438/475 |
| 6,808,967 B1 * | 10/2004 | Aspar et al. | 438/162 |
| 2002/0022348 A1 * | 2/2002 | Sakaguchi et al. | 438/480 |
| 2002/0086464 A1 * | 7/2002 | Houston | 438/149 |
| 2002/0123211 A1 | 9/2002 | Dolan et al. | |
| 2002/0137265 A1 * | 9/2002 | Yamazaki et al. | 438/150 |
| 2002/0160208 A1 * | 10/2002 | Ito | 428/446 |
| 2005/0170570 A1 * | 8/2005 | DeSouza et al. | 438/162 |

FOREIGN PATENT DOCUMENTS

| | | |
|---|---|---|
| EP | 1 137 069 A1 | 9/2001 |
| JP | A 10-079355 | 3/1998 |
| JP | B2 3036619 | 2/2000 |
| JP | A 2000-082679 | 3/2000 |
| JP | A 2000-091406 | 3/2000 |
| JP | 2001-0080335 | 8/2001 |
| JP | A 2001-257329 | 9/2001 |
| JP | A 2002-270614 | 9/2002 |
| KR | 2000-0011407 | 2/2000 |

* cited by examiner

METHOD OF PRODUCING SOI WAFER AND SOI WAFER

TECHNICAL FIELD

The present invention relates to a method of producing an SOI (Silicon on insulator) wafer having SOI structure in which a silicon layer is formed on an insulator, and an SOI wafer produced by the method thereof.

BACKGROUND ART

Recently, an SOI wafer having SOI structure in which a silicon layer (an SOI layer) is formed on an insulator has been especially attracting attention as a wafer for high-performance LSI for an electronic device because the SOI wafer is excellent in high-speed property, low power consumption, high breakdown voltage, environmental resistance, etc. of the device.

Representative production methods of the SOI wafer are bonding method, SIMOX (Separation by ion-implanted oxygen) method, and so on. The bonding method is a method of producing an SOI wafer by forming an oxide film on at least one of a bond wafer to form an SOI layer and a base wafer to be a supporting substrate, bonding the bond wafer to the base wafer through the oxide film, and making the bond wafer into a thin film.

Figure 2:
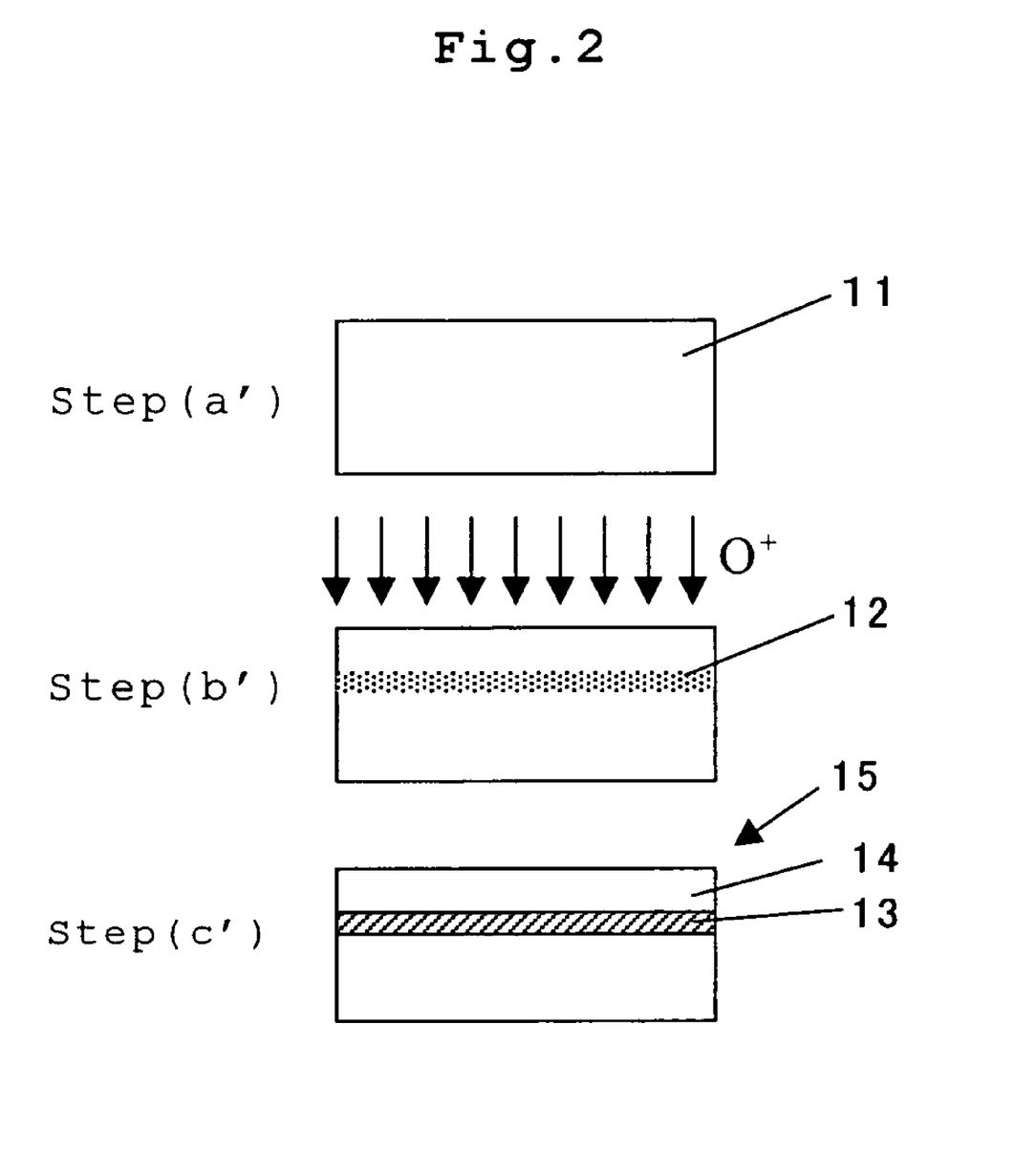
FIG. 2 is a flowchart illustrating a conventional method of producing an SOI wafer by SIMOX method.

Also, the SIMOX method is a method of producing an SOI wafer (SIMOX wafer) by subjecting to heat treatment to form an oxide film in a silicon wafer after implanting oxygen ions into the silicon wafer. More concretely, as shown in FIG. 2 for example, first a silicon wafer 11 subjected to mirror polishing etc. is prepared (Step (a')), and sequentially an oxygen ion-implanted layer 12 is formed by implanting oxygen ions ($O^+$) into the silicon wafer 11 heated at a temperature of about 500° C. from one main surface thereof at Step (b'). In this case, as an ion implantation condition, implantation energy is set generally 150-200 keV, and dose amount of oxygen ions is required to be high dose amount, about $1.5 \times 10^{18}/cm^2$ or more, to form a continuous buried oxide film.

And thereafter, at a Step (c'), oxide film-forming heat treatment to convert the oxygen ion-implanted layer 12 formed in the wafer into a buried oxide film 13 is performed, for example, in an atmosphere of an inert gas at a temperature of 1300° C. or more. Thereby SOI wafer 15 in which an SOI layer 14 is formed on the buried oxide film 13 can be produced.

The SOI wafer produced by SIMOX method as described above has advantages that there can be easily obtained excellent film thickness uniformity because a film thickness of the SOI layer and the buried oxide film can be determined by the ion implantation energy and dose amount when performing the oxygen ion implantation. And also the SOI wafer can be produced from one silicon wafer without requiring two wafers as the above bonding method. Therefore the SOI wafer can be produced at comparatively low cost.

However, in the case of performing the oxygen ion implantation by the high dose amount as above by using SIMOX method, although perfectness of the buried oxide film can be enhanced, there is an problem that it is difficult to obtain an SOI layer having a good crystal quality because damage is introduced to the wafer surface transmitted by a large amount of the oxygen ions so that threading dislocation is easily generated at high density in the SOI layer when performing the oxide film-forming heat treatment.

To solve such problems, various studies and investigations have been repeated. Through them, it was found that a continuous buried oxide film could be formed by oxygen ion implantation even at low dose amount. Thereby, an SOI wafer of which density of threading dislocation is low came to be produced (See "Science of SOI", edited by UCS Semiconductor Substrate Technology Workshop, published by Realize publishers, pp. 26-30). In this case, because the dose amount of the oxygen ions is limited to about $4 \times 10^{17}/cm^2$, the range of the dose amount is known as a dose window.

Though threading dislocation in the buried oxide film formed by such low dose amount can be reduced, pin holes causing insulation failure of the buried oxide film are easily formed. Therefore a quality of the buried oxide film is lower than that of the buried oxide film formed by high dose amount.

Accordingly, various methods are suggested to improve the quality of the buried oxide film formed by ion implantation by such low dose amount. For example a method was suggested that the quality of the buried oxide film is improved by so-called Internal Thermal Oxidation treatment (it is also described, "ITOX treatment" hereafter) in which after general oxide film-forming heat treatment, an oxidation treatment in the oxygen atmosphere at high temperature is sequentially performed (see, Publication of Japanese Patent No. 3036619). Thus, by adding ITOX treatment to SIMOX method performing oxygen ion implantation by such low dose amount, the buried oxide film is thickened so that the quality thereof is improved. Therefore it has become possible to produce a SIMOX wafer with high quality in which density of pin holes is low and perfectness of the buried oxide film is enhanced.

However, with higher integration of semiconductor devices in these years, production of a higher-quality SOI wafer is desired and, for example, an SOI wafer having a buried oxide film with a thin thickness is required. Moreover, it is believed that, in future, a thickness of the buried oxide film of an SOI wafer would become even thinner from 100 nm to 50 nm or less.

However, when an SOI wafer is produced by using SIMOX method as above, for example if oxygen ions are implanted by high dose amount required to form the continuous buried oxide film, a thickness of a buried oxide film formed an SOI wafer always become thicker than one thickness, and it was impossible to form the buried oxide film with a thin thickness as described above.

Also, when an SOI wafer is produced by implanting oxygen ions by low dose amount, about $4 \times 10^{17}/cm^2$ (dose window), the buried oxide film with thin thickness can be formed. However, because a quality of the buried oxide film is low, it is necessary to perform ITOX treatment to improve the quality of the buried oxide film as described above, and the buried oxide film in the silicon wafer is thickened to be thick one. Accordingly, it was extremely difficult to produce, by SIMOX method, an SOI wafer having the buried oxide film of which perfectness is high and the film thickness is thin as required in these days.

Moreover, an SOI wafer produced by the above SIMOX method is excellent in film thickness uniformity and production cost, compared to an SOI wafer produced by the aforementioned bonding method. However, there are problems that crystal defects existing in the SOI layer are much and crystallinity of the SOI layer is inferior and also surface roughness of the SOI layer is large. Therefore, in production of an SOI wafer by SIMOX method, improvement of crystallinity of an SOI layer and improvement of surface quality are desired.

DISCLOSURE OF THE INVENTION

Accordingly, the present invention was conceived in view of the above problems. An object of the present invention is to provide a method of producing an SOI wafer in which by using SIMOX method, there can be produced a high quality SOI wafer having a buried oxide film of which the film thickness is thin and perfectness is high, and an SOI layer of which crystallinity and surface quality are extremely good.

In order to accomplish the above object, according to the present invention, there is provided a method of producing an SOI wafer, comprising at least steps of forming an oxygen ion-implanted layer by implanting oxygen ions into a silicon wafer from one main surface thereof, subjecting the silicon wafer to oxide film-forming heat treatment to convert the oxygen ion-implanted layer into a buried oxide film, and thereby producing an SOI wafer having an SOI layer on the buried oxide film, wherein when the buried oxide film is formed in the silicon wafer, the buried oxide film is formed so that a thickness thereof is thicker than a thickness of the buried oxide film which the SOI wafer to be produced has, and thereafter the silicon wafer in which the thicker buried oxide film is formed is subjected to a heat treatment to reduce the thickness of the buried oxide film.

As described above, in a method of producing an SOI wafer by using SIMOX method, when the buried oxide film is formed in a silicon wafer, the buried oxide film is once formed so that a thickness thereof is thicker than a thickness of the buried oxide film desired in the SOI wafer to be produced, and thereafter the silicon wafer in which the thicker buried oxide film is formed is subjected to a heat treatment to reduce the thickness of the buried oxide film. Thereby there can be easily produced a high quality SOI wafer having a buried oxide film of which film thickness is thin, for example, 100 nm or less and further less than 50 nm and perfectness is enhanced. Also, because the thickness of the buried oxide film is reduced by the heat treatment as described above, the part of the reduced thickness is reduced to be a silicon layer with good crystallinity. Moreover, because an SOI layer is grown by solid-phase growth from the silicon layer with good crystallinity as a seed in the heat treatment to reduce the thickness of the buried oxide film, crystallinity of the SOI layer becomes extremely good, and concurrently surface roughness of the SOI layer is improved so as to improve its surface quality.

In this case, it is preferable that the heat treatment to reduce the thickness of the buried oxide film is performed in an atmosphere of a hydrogen gas, an argon gas, or a mixed gas of those at a temperature of 1000° C. or more.

By performing the heat treatment to reduce the thickness of the buried oxide film under the condition, the thickness of the buried oxide film can be effectively reduced so that the buried oxide film having a desired thin thickness can be obtained certainly, and also crystallinity and surface quality of the SOI layer can be certainly improved.

Also, it is preferable that oxygen concentration contained in the heat treatment atmosphere of the heat treatment to reduce the thickness of the buried oxide film is 10 ppm or less.

When the heat treatment to reduce the thickness of the buried oxide film is performed, if an oxygen is contained at concentration of more than 10 ppm in the heat treatment atmosphere, it is feared that the surface of the SOI wafer in the heat treatment is etched so that surface roughness and film thickness uniformity of the SOI layer become worse. Accordingly, oxygen concentration contained in the heat treatment atmosphere of the heat treatment to reduce the thickness of the buried oxide film is thus 10 ppm or less, and thereby the wafer surface is prevented from etching in the heat treatment, and there can be produced an SOI wafer formed an SOI layer having excellent surface roughness and film thickness uniformity.

Moreover, it is preferable that material of a wafer boat and/or a heat treatment tube used in the heat treatment to reduce the thickness of the buried oxide film is Si, SiC, or at least one coated thereby on the internal wall surface.

As described above, if a wafer boat and/or a heat treatment tube of which material is Si, SiC, containing no oxygen as a main component, or at least one coated thereby on the internal wall surface is used, oxygen concentration in the heat treatment atmosphere can be maintained low. And therefore the etching caused in the wafer surface in the heat treatment to reduce the thickness of the buried oxide film as described above can be certainly prevented.

Also, in the method of producing an SOI wafer of the present invention, it is preferable that when the buried oxide film is formed in the silicon wafer, the silicon wafer is subjected to internal thermal oxidation treatment of the buried oxide film after the oxide film-forming heat treatment is performed.

As described above, if the internal thermal oxidation treatment of the buried oxide film, namely ITOX treatment, is added to form a buried oxide film after the silicon wafer is subjected to the oxide film-forming heat treatment, it easily becomes possible to thicken the thickness of the buried oxide film more than the thickness of the buried oxide film in the SOI wafer to be produced. Moreover, for example, in the case of forming a buried oxide film by implanting oxygen ions by low dose amount, the quality of the buried oxide film can be improved by performing the ITOX treatment. Thus the extremely high quality SOI wafer in which perfectness of the buried oxide film is high can be produced.

Also, it is preferable that after the heat treatment to reduce the thickness of the buried oxide film is performed, a sacrificial oxidation treatment is further performed in order to adjust the film thickness of the SOI layer.

As described above, after the heat treatment to reduce the thickness of the buried oxide film, by performing a so-called sacrificial oxidation treatment in which a thermal oxide film is further formed on the SOI layer and then the oxide film is eliminated, a damage layer generated in the surface of SOI wafer by oxygen ion implantation can be eliminated, and a crystal quality of the SOI layer is further enhanced as well as the film thickness of the SOI layer can be adjusted.

And, according to the present invention, there can be provided an SOI wafer produced by the above-described method of producing an SOI wafer of the present invention.

If an SOI wafer is produced by the method of producing an SOI wafer of the present invention, there can be provided a high quality SIMOX wafer having a buried oxide film of which the film thickness is thin and perfectness is high, and an SOI layer of which crystallinity and surface quality is extremely good.

Particularly, in the present invention, it is possible that a thickness of the buried oxide film of the SOI wafer is less than 50 nm.

As described above, the SOI wafer of the present invention can be an very high quality SIMOX wafer in which a thickness of the buried oxide film is less than 50 nm, which was conventionally difficult to produce.

As explained above, according to the present invention, when using SIMOX method, there can be easily produced an high quality SOI wafer in which a film thickness of a buried oxide film is thin and perfectness is high, and crystallinity and surface quality of an SOI layer are extremely good.

BEST MODE FOR CARRYING OUT THE INVENTION

Hereinafter, embodiments of the present invention will now be described. However, the present invention is not limited thereto.

With higher integration of semiconductor devices, it is required that a buried oxide film formed in an SOI wafer is thin such as 100 nm or less in film thickness, and moreover in future it is believed that the requirement for the thinner buried oxide film will be severe, and thus, production of an SOI wafer having a buried oxide film thickness of, for example, 50 nm or less, 20 nm, or 10 nm will be required.

However, in the case of producing an SOI wafer by using SIMOX method, a film thickness of the buried oxide film naturally becomes thick as described above, and therefore, in the production of an SOI wafer by conventional SIMOX method, it was impossible to produce a high quality SOI wafer having a buried oxide film of which perfectness is high and a film thickness is thin.

Accordingly, the inventors of the present invention have assiduously studied and investigated a method of producing an SOI wafer in which having a buried oxide film of which a film thickness is thin and perfectness is enhanced. As a result, they found that when a buried oxide film is formed in a silicon wafer, the buried oxide film is once formed so that a thickness thereof is thicker than a thickness of the buried oxide film which the SOI wafer to be finally produced has, and thereafter the silicon wafer in which the thicker buried oxide film is formed is subjected to a heat treatment to reduce the thickness of the buried oxide film, and thereby a film thickness of the buried oxide film of the SOI wafer produced by SIMOX method can be reduced, and moreover thereby there can be produced a high quality SOI wafer having the buried oxide film of which a film thickness is thinner and perfectness is higher compared to conventional one, and an SOI layer of which crystallinity and surface quality are extremely good. Finally the present invention was completed.

Figure 1:
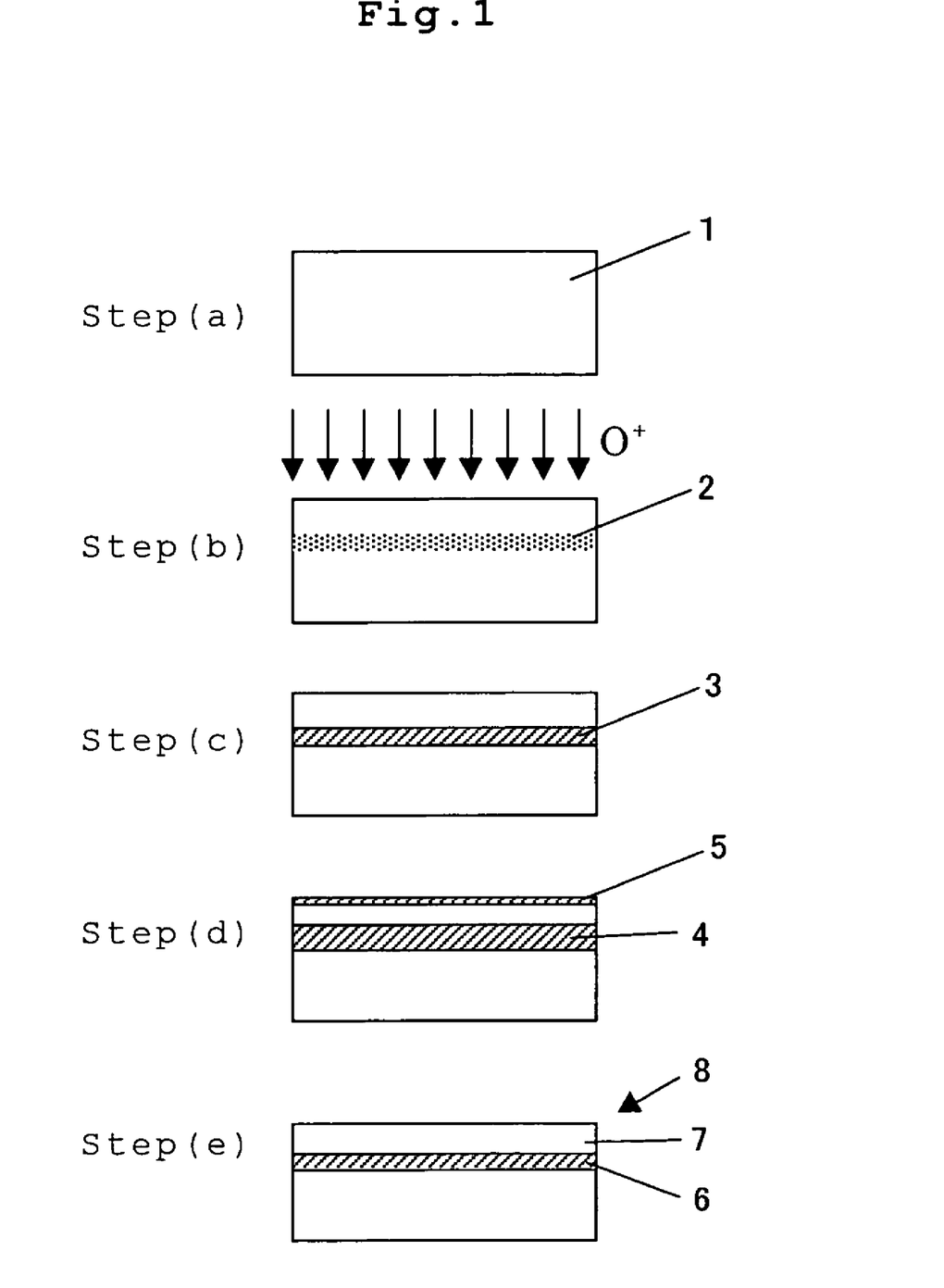
FIG. 1 is a flowchart illustrating an example of a method of producing an SOI wafer by SIMOX method according to the present invention.

Hereinafter, a method of producing an SOI wafer of the present invention will be explained in detail by illustrating a case where a buried oxide film is formed by implanting oxygen ions by low dose amount (a dose window) by SIMOX method with reference to the drawings. However the present invention is not limited thereto. Here, FIG. 1 is a flowchart illustrating an example of a method of producing an SOI wafer by SIMOX method according to the present invention.

First, a silicon wafer 1 subjected to mirror polishing is prepared (Step (a)). Thus, if a silicon wafer is subjected to mirror polishing, flatness in a mirror polishing surface of the wafer is approximately maintained in the SOI wafer to be produced, and therefore there can be obtained an SOI wafer having high flatness.

Sequentially, an oxygen ion-implanted layer 2 is formed by implanting oxygen ions ($O^+$) into a silicon wafer 1 heated at a temperature of about 500° C. from one main surface thereof to a predetermined depth at Step (b). In this case, a condition of the ion implantation is not limited particularly. However, to perform the ion implantation, for example, implantation energy may be set about 150-200 keV used generally and commonly, and dose amount may be set low dose amount, about $4.0 \times 10^{17}/cm^2$, so as to prevent generation of threading dislocation in the following oxide film-forming heat treatment. In this case, the oxygen ion implantation may be performed in parts if necessary.

After an oxygen ion-implanted layer 2 is formed in the silicon wafer 1, the oxide film-forming heat treatment to convert the oxygen-ion implanted layer 2 to a buried oxide film 3 is performed at step (c). Heat treatment condition of the oxide film-forming heat treatment is not particularly limited, so long as the oxygen-ion implanted layer can be converted to the buried oxide film. However, for example, the buried oxide film 3 can be formed by performing heat treatment for 3-6 hours at temperature of 1300° C. to the melt point of silicon in an argon gas atmosphere in which oxygen concentration is 1% or less. In this case, in the buried oxide film 3, the film thickness is thin and pin holes are easily formed on account of low dose amount of oxygen ions.

Next, the Internal Thermal Oxidation treatment (ITOX treatment) of the buried oxide film is subjected to the silicon wafer to improve the quality of the buried oxide film at step (d). For example, the silicon wafer in which the buried oxide film 3 was formed is subjected to ITOX treatment for several hours at temperature of 1150° C. to the melt point of silicon in an atmosphere of an oxygen gas, and thereby a buried oxide film 4 which is thickened can be formed in the silicon wafer. Thus by performing ITOX treatment, pin holes of the buried oxide film can be reduced and also roughness of interface between the SOI layer and the buried oxide film can be improved, and therefore there can be obtained a buried oxide film with excellent quality.

In addition, if a thickness of the buried oxide film 3 immediately after the oxide film-forming heat treatment at step (c) is thicker than a thickness of the buried oxide film desired for the SOI wafer to be finally produced, the above ITOX treatment is not necessarily performed. However, even in this case, the quality of the buried oxide film can be improved by adding the ITOX treatment.

Also, if the silicon wafer is thus subjected to ITOX treatment, a thermal oxide film 5 is formed on the wafer surface.

And then, after the thermal oxide film 5 formed on the wafer surface is removed by etching, or mechano-chemical polishing, etc, the silicon wafer formed the buried oxide film 4 of which the film thickness is thick is subjected to heat treatment to reduce the thickness of the buried oxide film at step (e). Thus, by performing the heat treatment to reduce the thickness of the buried oxide film, there can be produced an SOI wafer 8 having a buried oxide film 6 of which the film thickness is reduced to the desired thickness, and an SOI layer 7 on the buried oxide film 6. A thickness of the buried oxide film 6 of the SOI wafer 8 finally obtained is determined by product specifications, and according to the present invention, there can be formed a very thin buried oxide film of which thickness is 100 nm or less, further 50 nm or less, and also less than 50 nm.

In addition, the heat treatment to reduce the thickness of the buried oxide film is performed after ITOX treatment in the above flowchart. However ITOX treatment may be performed after the heat treatment to reduce the thickness of the buried oxide film, and also they may be performed repeatedly so as to farther improve the quality of the buried oxide film.

Also in the present invention, because the heat treatment is thus performed to reduce the film thickness of the buried oxide film, the part of the reduced thickness is reduced to be a silicon layer with good crystallinity. Moreover because an SOI layer is grown by solid-phase growth from the silicon layer with good crystallinity as a seed in the heat treatment, crystallinity of the SOI layer can be enhanced, and concurrently surface roughness of the SOI layer can be also enhanced to improve the surface quality thereof.

In addition, when the heat treatment is performed to reduce a thickness of the buried oxide film, if the thermal oxide film 5 formed by ITOX treatment remains on the wafer surface, it is difficult to reduce the film thickness of the buried oxide film. Accordingly, if an oxide film is formed on the surface of the silicon wafer, it is preferable that the heat treatment to reduce the thickness of the buried oxide film is performed without the oxide film on the wafer surface by removing the oxide film on the wafer surface as described above.

Also, the heat treatment condition of the above heat treatment to reduce the thickness of the buried oxide film may be determined according to need, and is not particularly limited. However, for example, the heat treatment may be performed in an atmosphere of a hydrogen gas, an argon gas, or a mixed gas of those at a temperature of 1000° C. or more, preferably 1100° C. or more, and more preferably 1150° C. or more. The heat treatment to reduce the thickness of the buried oxide film is performed under such a heat treatment condition so as to reduce the thickness of the buried oxide film effectively. And therefore there can be easily obtained the buried oxide film having the thickness, for example, less than 100 nm, such as 10-80 nm, as to be product specifications.

Here, there will be shown experimental results concerning a relation between heat treatment time of the heat treatment to reduce the thickness of the buried oxide film and the reduction amount of the thickness of the buried oxide film, and a relation between the thickness of the SOI layer formed in the SOI wafer and the reduction amount of the thickness of the buried oxide film.

First, in order to investigate the relation between the heat treatment time and the reduction amount of the thickness of the buried oxide film, there were prepared three silicon wafers having an SOI layer with a thickness of 276 nm by removing a thermal oxide film formed on the wafer surface after ITOX treatment. Next, each silicon wafer was subjected to heat treatment to reduce the thickness of the buried oxide film in the 100% argon gas atmosphere at 1200° C. for heat treatment times of 1 hour, 2 hours or 4 hours, and thereafter, reduction amount of the thickness of the buried oxide film under each heat treatment condition was measured. The measurement of reduction amount of the thickness of the buried oxide film was performed by measuring the thickness of the buried oxide film of each silicon wafer before and after the heat treatment with a Multilayer Optical Spectrometric Scanner (manufactured by SOPRA).

Figure 3:
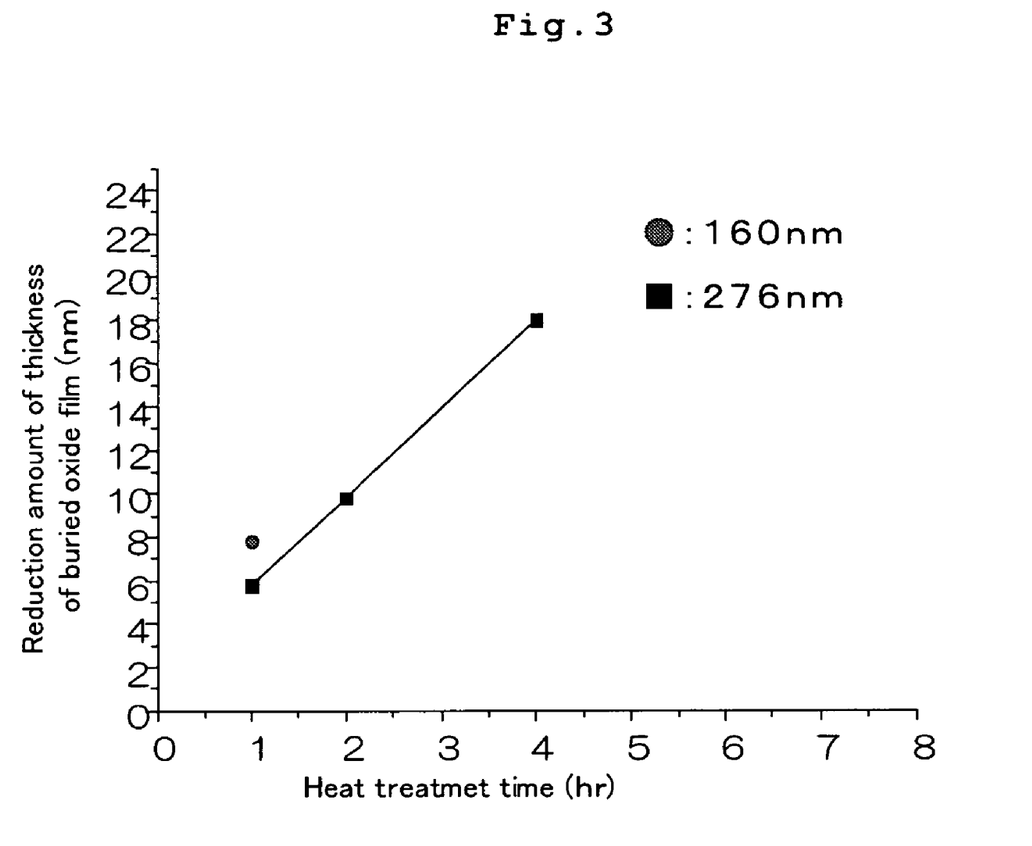
FIG. 3 is a graph illustrating a relation between heat treatment time of the heat treatment to reduce a thickness of a buried oxide film and a reduction amount of a thickness of the buried oxide film, and a relation between a thickness of an SOI layer formed in an SOI wafer and a reduction amount of a thickness of the buried oxide film.

As a result, as shown in FIG. 3, it was found that as the heat treatment time becomes longer, the reduction amount of the thickness of the buried oxide film becomes larger. Although not shown in FIG. 3, in the case of the same heat treatment time, as the heat treatment temperature became higher, the reduction amount of the thickness of the buried oxide film became larger, and when the heat treatment temperature was less than 1000° C., the reduction amount of the thickness of the buried oxide film became even smaller.

Next, there was prepared a silicon wafer having an SOI layer of which a thickness was 160 nm, and the silicon wafer was subjected to heat treatment to reduce the thickness of the buried oxide film in the 100% argon gas atmosphere at 1200° C. for 1 hour. Thereafter, reduction amount of the thickness of the buried oxide film was measured similarly as described above. The result of the measurement is shown in FIG. 3 together.

As clear from FIG. 3, by reducing the thickness of the SOI layer formed on the buried oxide film from 276 nm to 160 nm, the reduction amount of the thickness of the buried oxide film in the heat treatment can be increased. It was revealed that the reduction amount of the thickness of the buried oxide film changed according to a thickness of the SOI layer. Accordingly, when the heat treatment to reduce the thickness of the buried oxide film is performed, it is desirable to determine the heat treatment condition by also controlling a thickness of an SOI layer formed on a buried oxide film.

Also, when the above heat treatment to reduce the thickness of the buried oxide film is performed, if oxygen concentration contained in the heat treatment atmosphere is more than 10 ppm, it is feared that in the heat treatment the surface of the SOI wafer is etched so that surface roughness and film thickness uniformity of the SOI layer become worse. Accordingly, when the heat treatment to reduce the thickness of the buried oxide film is performed, it is preferable that oxygen concentration contained in the heat treatment atmosphere is 10 ppm or less. Thereby the surface of the SOI wafer is prevented from etching in the heat treatment, and there can be produced an SOI wafer formed an SOI layer having excellent surface roughness and film thickness uniformity.

Also, the heat treatment apparatus used when the above heat treatment to reduce the thickness of the buried oxide film is performed is not particularly limited, and a generally used heat treatment device can be used. However, if, for example, a quartz boat and a quartz tube which are generally frequently used is used for a wafer boat holding a wafer and for a heat treatment tube being a reaction chamber, it is feared that by affect of oxygen contained therein as an main component, the surface of the SOI wafer in the heat treatment is etched so that surface roughness and film thickness uniformity of the SOI layer become worse as described above.

Accordingly, it is preferable that material of the wafer boat and/or the heat treatment tube used in the heat treatment to reduce the thickness of the buried oxide film is Si, SiC, containing no oxygen as a main component, or at least one coated thereby on the internal wall surface. By using a wafer boat or a heat treatment tube made of such material, oxygen concentration in the heat treatment atmosphere can be maintained low so that the etching caused on the wafer surface in the heat treatment can be certainly prevented.

Moreover, in a method of producing an SOI wafer of the present invention, it is preferable that after performing the heat treatment to reduce the thickness of the buried oxide film, a so-called sacrificial oxidation treatment by which thermal oxide film is formed on the SOI layer and then the oxide film is eliminated is performed.

For example, after performing the heat treatment to reduce the thickness of the buried oxide film, a thermal oxide film is formed on the surface of the SOI layer by performing heat treatment in an oxidizing atmosphere, and then the oxide film formed on the surface of the SOI layer may be removed by etching with a solution containing HF. If etching is performed with a solution containing HF as described above, only the oxide film is removed. Thus, there can be obtained an SOI wafer in which damage and contamination, such as heavy metals, are eliminated by the sacrificial oxidation.

As described above, by further performing the sacrificial oxidation treatment after the heat treatment to reduce the thickness of the buried oxide film, a damage layer generated by oxygen ion implantation on the surface of the SOI wafer can be certainly eliminated. And crystal quality of the SOI layer can be further enhanced as well as the film thickness of the SOI layer can be adjusted, and thereby there can be produced a higher quality SOI wafer.

By producing an SOI wafer by the method as described above, a thicker buried oxide film is once formed so as to stabilize the quality, and thereafter the thickness of the buried oxide film is reduced by performing heat treatment to reduce the thickness of the buried oxide film. Therefore, there can be produced a high quality SOI wafer in which a buried oxide film of which the film thickness is thin and perfectness is high and in which crystallinity and surface quality of an SOI layer are extremely good.

Hereinafter, the present invention will be explained further in detail with reference to Examples and Comparative Examples. However, the present invention is not limited thereto.

EXAMPLE 1

Mirror-polished silicon wafers having a diameter of 200 mm were prepared to produce SOI wafers having a buried oxide film with a thickness of 80 nm as product specifications by SIMOX method.

First, an oxygen ion-implanted layer was formed in the silicon wafer by implanting oxygen ions into the silicon wafer heated at a temperature of about 500° C. from one main surface thereof under a condition that implantation energy is set 180 keV and dose amount is set $4.0 \times 10^{17}/cm^2$. Sequentially, after buried oxide film-forming heat treatment is performed in an argon gas atmosphere in which an oxygen concentration is 0.5% at 1350° C. for 4 hours to convert the oxygen ion-implanted layer to a buried oxide film, the buried oxide film in the silicon wafer was thickened by performing ITOX treatment in a mixed gas atmosphere of an argon gas and an oxygen gas (oxygen concentration is 70%) at 1350° C. for 4 hours.

Next, after the oxide film formed on the wafer surface was etched to remove with a solution containing HF, the obtained silicon wafer was subjected to heat treatment to reduce the thickness of the buried oxide film in an argon gas atmosphere (oxygen concentration was 10 ppm or less) at 1200° C. for 4 hours. Therefore there was produced an SOI wafer having a buried oxide film of which the thickness was 80 nm by reducing the thickness of the buried oxide by 30 nm.

COMPARATIVE EXAMPLE 1

Mirror-polished silicon wafers having a diameter of 200 mm were prepared. First, an oxygen ion-implanted layer was formed by implanting oxygen ions into the silicon wafer heated at a temperature of about 500° C. from one main surface thereof under a condition that implantation energy was 180 keV and dose amount was $4.0 \times 10^{17}/cm^2$. Sequentially, after performing buried oxide film-forming heat treatment in an argon gas atmosphere in which an oxygen concentration was 0.5% at 1350° C. for 4 hours to convert the oxygen ion-implanted layer to a buried oxide film, ITOX treatment was performed in a mixed gas atmosphere of an argon gas and an oxygen gas (oxygen concentration was 70%) at 1350° C. for 4 hours to thicken the buried oxide film in the silicon wafer. Therefore there was produced an SOI wafer having a buried oxide film with the thickness of 110 nm (Heat treatment to reduce the thickness of the buried oxide film was not performed).

COMPARATIVE EXAMPLE 2

Mirror-polished silicon wafers having a diameter of 200 mm were prepared. First an oxygen ion-implanted layer was formed by implanting oxygen ions into the silicon wafer heated at a temperature of about 500° C. from one main surface thereof in condition that implantation energy was 180 keV and dose amount was $4.0 \times 10^{17}/cm^2$. Sequentially, buried oxide film-forming heat treatment was performed in an argon gas atmosphere in which oxygen concentration was 0.5% at 1350° C. for 4 hours to convert the oxygen ion-implanted layer to a buried oxide film. Therefore there was produced an SOI wafer having a buried oxide film with the thickness of 80 nm (ITOX treatment and heat treatment to reduce the thickness of the buried oxide were not performed).

As to SOI wafers produced in the above-described Example 1 and Comparative Examples 1 and 2, after each SOI wafer was immersed to HF solution, HF defects formed in the SOI layer of each SOI wafer and pin holes formed in the buried oxide film thereof were scanned by an optical microscope to measure densities of them. Results of these measurements are shown in Table 1 with production conditions of the above SOI wafers as follows.

TABLE 1

|  | Example 1 | Comparative Example 1 | Comparative Example 2 |
|---|---|---|---|
| Oxygen ion implantation | Implantation energy: 180 keV, Dose amount: $4.0 \times 10^{17}/cm^2$ | | |
| Oxide film-forming heat treatment | In an Ar gas atmosphere in which oxygen concentration was 0.5% at 1350° C. for 4 hours | | |
| ITOX treatment | In a mixed gas atmosphere of an Ar gas and an oxygen gas (oxygen concentration was 70%) at 1350° C. for 4 hours | | Non |
| Buried oxide film thickness | 110 | 110 | 80 |
| Heat treatment to reduce thickness of buried oxide film | In the 100% argon gas atmosphere at 1200° C. for 4 hours (✕) | Non | |
| Final thickness of buried oxide film | 80 | 110 | 80 |
| Density of HF defects | <1 number/cm² | <1 number/cm² | <1 number/cm² |
| Density of pin holes | 15 number/cm² | 15 number/cm² | 50 number/cm² |

(✕) $O_2$ amount contained in the Ar gas ≦ 10 ppm,
Material of heat treatment tube: SiC,
Material of wafer boat: Si As shown in Table 1, it was revealed that the SOI wafer of the present invention (Example 1) have the buried oxide film with quality equal to the conventional SIMOX wafer subjected to ITOX treatment (Comparative Example 1) although the film thickness of the buried oxide film thereof is thin, 80 nm. On the other hand, the SOI wafer of Comparative Example 2 was not subjected to ITOX treatment to form a buried oxide film of which the film thickness is 80 nm, and therefore pin holes were remarkably generated in the buried oxide film and the quality of the buried oxide film was very low.

And, after SOI wafers were made again under the same condition as Example 1, and Comparative example 1, further a sacrificial oxidation treatment was performed to produce SOI wafers having an SOI layer of which a thickness was 30 nm or less. And, density of HF defects of each SOI wafer was measured and compared similarly as described above. As a result, it was hardly deferent between both of the SOI wafers. Namely, it was confirmed that, as to the SOI wafer of the present invention, there can be obtained sufficient crystallinity in an area where $SiO_2$ is reduced to be an SOI layer by heat treatment to reduce the thickness of the buried oxide film.

EXAMPLE 2

Several SOI wafers made under the same condition as above Example 1 and having buried oxide film with a thickness of 80 nm were prepared. Heat treatment to reduce the thickness of the buried oxide film which was performed in an argon gas atmosphere (Oxide concentration was 10 ppm or less) at 1200° C. was added to them by adjusting heat treatment time. Thereby there could be obtained SOI wafers of which final buried oxide film thickness were 40 nm, 20 nm, 10 nm, and 5 nm. And, as to the SOI wafers, as a result of measurement of density of HF defects and density of pin holes similarly as Example 1, they were observed to be equal to those of Example 1 and Comparative example 1.

As described above, according to the present invention, even if SIMOX method by which an SOI wafer can be produced from one wafer is adopted without using bonding method which requires two wafers when producing an SOI wafer, there can be obtained a high quality SOI wafer of which buried oxide film thickness is less than 50 nm, which could not be obtained by conventional SIMOX method.

The present invention is not limited to the embodiments described above. The above-described embodiments were mere examples, and those having the substantially same structure as that described in the appended claims and providing the similar working effects are included in the scope of the present invention.

For example, in the above-described embodiments, there is produced an SOI wafer mainly by implanting oxygen ions by low dose amount (dose window). However, the present invention is not limited thereto and also can be similarly applied to the case of producing an SOI wafer by implanting oxygen ions by high dose amount. For example, after a buried oxide film is formed by implanting oxygen ions by high dose amount so that a thickness thereof is thicker than a desired thickness, a heat treatment to reduce the thickness of the buried oxide film is performed, and thereby there can be produced a desired SIMOX wafer in which a buried oxide film of which film thickness is thin is formed.

The invention claimed is:

1. A method of producing an SOI wafer, comprising:
   forming an oxygen ion-implanted layer by implanting oxygen ions into a silicon wafer from one main surface of the silicon wafer;
   subjecting the silicon wafer to oxide film-forming heat treatment to convert the oxygen ion-implanted layer into a buried oxide film;
   subjecting the silicon wafer to internal thermal oxidation treatment of the buried oxide film, thereby producing an SOI wafer having an SOI layer on the buried oxide film, the subjecting the silicon wafer to internal thermal oxidation treatment of the buried oxide film being performed such that the buried oxide film is formed with a thickness greater than a thickness of the buried oxide film of the SOI wafer ultimately produced; and
   subsequently subjecting the silicon wafer in which the thicker buried oxide film is formed to a heat treatment to reduce the thickness of the buried oxide film, so as to form the buried oxide film to have a film thickness of 100 nm or less;
   wherein after the heat treatment to reduce the thickness of the buried oxide film is performed, a sacrificial oxidation treatment is further performed in order to adjust the film thickness of the SOI layer.

2. The method of producing an SOI wafer according to claim 1, wherein the heat treatment to reduce the thickness of the buried oxide film is performed in an atmosphere of a hydrogen gas, an argon gas, or a mixed gas of those at a temperature of 1000° C. or more.

3. The method of producing an SOI wafer according to claim 2, wherein oxygen concentration contained in the heat treatment atmosphere of the heat treatment to reduce the thickness of the buried oxide film is 10 ppm or less.

4. The method of producing an SOI wafer according to claim 1, wherein material of a wafer boat and/or a heat treatment tube used in the heat treatment to reduce the thickness of the buried oxide film is Si, SiC, or at least one coated thereby on the internal wall surface.

5. An SOI wafer produced by the method of producing an SOI wafer according to claim 1, wherein the thickness of the buried oxide film of the SOI wafer is less than 50 nm.

* * * * *